United States Patent
Sandström

(10) Patent No.: US 9,459,540 B2
(45) Date of Patent: Oct. 4, 2016

(54) MECHANICALLY PRODUCED ALIGNMENT FIDUCIAL METHOD AND DEVICE

(71) Applicant: Micronic Mydata AB, Täby (SE)

(72) Inventor: Torbjörn Sandström, Pixbo (SE)

(73) Assignee: Mycronic AB, Taby (SE)

( * ) Notice: Subject to any disclaimer, the term of this patent is extended or adjusted under 35 U.S.C. 154(b) by 73 days.

(21) Appl. No.: 14/207,467

(22) Filed: Mar. 12, 2014

(65) Prior Publication Data

US 2014/0268088 A1    Sep. 18, 2014

Related U.S. Application Data

(60) Provisional application No. 61/777,469, filed on Mar. 12, 2013.

(51) Int. Cl.
| | |
|---|---|
| *G03B 27/42* | (2006.01) |
| *G03F 7/20* | (2006.01) |
| *G03F 1/42* | (2012.01) |
| *G03F 9/00* | (2006.01) |

(52) U.S. Cl.
CPC ............ *G03F 7/70775* (2013.01); *G03F 1/42* (2013.01); *G03F 9/708* (2013.01); *G03F 9/7088* (2013.01)

(58) Field of Classification Search
CPC ...... G03F 7/70775; G03F 1/42; G03F 9/708; G03F 9/7088
See application file for complete search history.

(56) References Cited

U.S. PATENT DOCUMENTS

| | | |
|---|---|---|
| 4,131,782 A | 12/1978 | Einstein et al. |
| 4,322,260 A | 3/1982 | Conlon |
| 4,377,736 A | 3/1983 | Daunt et al. |
| 4,431,923 A * | 2/1984 | Wang .................. G03F 7/70375 250/491.1 |
| 4,533,813 A | 8/1985 | Rayburn et al. |
| 4,628,179 A | 12/1986 | Crahay |
| 4,652,722 A | 3/1987 | Stone et al. |
| 4,734,746 A | 3/1988 | Ushida et al. |

(Continued)

FOREIGN PATENT DOCUMENTS

| | | |
|---|---|---|
| EP | 0157546 A2 | 10/1985 |
| EP | 1132776 A2 | 9/2001 |

(Continued)

OTHER PUBLICATIONS

Machine translation of KR 2006016281.*

(Continued)

*Primary Examiner* — Deoram Persaud
(74) *Attorney, Agent, or Firm* — Haynes Beffel & Wolfeld LLP; Ernest J. Beffel, Jr.

(57) ABSTRACT

The technology disclosed relates to methods and systems that can be used to reduce visible artifacts know as mura. In particular, it relates to producing alignment marks by physically modifying appearance of a layer of exposure or radiation sensitive material on a workpiece, then using those alignment marks or transferred direct or inverted images of those marks to realign a writing coordinate system between exposure writing passes, following physical movement of the workpiece within the writing system. The physical modifications described include mechanically pressing a mark into the layer, using a laser to ash or ablate the layer, or applying an ink or other substance to the surface of the laser.

19 Claims, 16 Drawing Sheets

(56) References Cited

U.S. PATENT DOCUMENTS

| | | | |
|---|---|---|---|
| 4,758,705 A | 7/1988 | Hertzel et al. | |
| 4,812,661 A | 3/1989 | Owen | |
| 4,958,373 A | 9/1990 | Usami et al. | |
| 4,977,458 A | 12/1990 | Granger et al. | |
| 5,049,901 A | 9/1991 | Gelbart | |
| 5,065,193 A | 11/1991 | Saitoh et al. | |
| 5,147,680 A | 9/1992 | Slysh | |
| 5,247,155 A | 9/1993 | Steen et al. | |
| 5,278,385 A | 1/1994 | Gerome et al. | |
| 5,296,036 A | 3/1994 | Matsuyama et al. | |
| 5,315,384 A | 5/1994 | Heffington et al. | |
| 5,402,155 A | 3/1995 | Hatayama et al. | |
| 5,495,279 A | 2/1996 | Sandstrom et al. | |
| 5,535,672 A | 7/1996 | Kuwahara | |
| 5,663,783 A | 9/1997 | Ueda | |
| 5,668,588 A | 9/1997 | Morizumi et al. | |
| 5,733,711 A * | 3/1998 | Juengling | G03F 7/00 430/22 |
| 5,868,075 A | 2/1999 | Kline et al. | |
| 5,917,935 A | 6/1999 | Hawthorne et al. | |
| 5,991,038 A | 11/1999 | Yamamoto et al. | |
| 6,051,845 A * | 4/2000 | Uritsky | H01L 21/67282 250/559.3 |
| 6,066,830 A | 5/2000 | Cline et al. | |
| 6,130,405 A | 10/2000 | Loringer | |
| 6,151,109 A | 11/2000 | Bromssen et al. | |
| 6,154,561 A | 11/2000 | Pratt et al. | |
| 6,285,488 B1 | 9/2001 | Sandstrom et al. | |
| 6,489,984 B1 | 12/2002 | Johnson | |
| 6,542,178 B2 | 4/2003 | Miyagawa et al. | |
| 6,586,702 B2 | 7/2003 | Wiener-Avnear et al. | |
| 6,625,181 B1 | 9/2003 | Oshemkov et al. | |
| 6,717,756 B2 | 4/2004 | Berman et al. | |
| 6,822,192 B1 | 11/2004 | Young | |
| 7,289,137 B2 | 10/2007 | Liebig et al. | |
| 7,411,651 B2 | 8/2008 | Ostrom et al. | |
| 7,806,731 B2 | 10/2010 | Takiar et al. | |
| 8,102,410 B2 | 1/2012 | Sandstrom | |
| 8,160,351 B2 | 4/2012 | Sandstrom et al. | |
| RE43,509 E | 7/2012 | Asai et al. | |
| 8,228,473 B2 | 7/2012 | Sawasaki et al. | |
| 8,247,032 B2 | 8/2012 | Mirkin et al. | |
| 8,283,192 B2 | 10/2012 | Watanabe | |
| 8,361,876 B2 | 1/2013 | Ishimaru et al. | |
| 8,372,564 B2 | 2/2013 | Shoki | |
| 8,377,349 B2 | 2/2013 | Sato | |
| 8,767,185 B2 | 7/2014 | Sandstrom | |
| 2003/0151008 A1 | 8/2003 | Yamada | |
| 2003/0218667 A1 | 11/2003 | Williams et al. | |
| 2004/0029024 A1 | 2/2004 | Ohnuma | |
| 2004/0081499 A1 | 4/2004 | Sasaki | |
| 2004/0150707 A1 | 8/2004 | Stiblert et al. | |
| 2004/0213449 A1 | 10/2004 | Safaee-Rad et al. | |
| 2005/0007364 A1 | 1/2005 | Oyama et al. | |
| 2005/0018255 A1 | 1/2005 | Nakaya et al. | |
| 2005/0052464 A1 | 3/2005 | Okuyama | |
| 2005/0104953 A1 | 5/2005 | Suzuki et al. | |
| 2005/0157161 A1 | 7/2005 | Fukuda | |
| 2005/0191771 A1 * | 9/2005 | Li | B23K 26/0613 438/14 |
| 2005/0220330 A1 | 10/2005 | Kobayashi et al. | |
| 2005/0271262 A1 | 12/2005 | Yoshida | |
| 2005/0280805 A1 | 12/2005 | Murai | |
| 2005/0281174 A1 * | 12/2005 | Gotsmann | B82Y 10/00 369/126 |
| 2006/0007431 A1 * | 1/2006 | Smith | B82Y 10/00 356/150 |
| 2006/0027536 A1 * | 2/2006 | Kornrumpf | B29C 65/18 219/50 |
| 2006/0092199 A1 | 5/2006 | White et al. | |
| 2006/0158642 A1 | 7/2006 | Tanaka | |
| 2006/0158643 A1 | 7/2006 | Yoshida | |
| 2006/0197826 A1 | 9/2006 | Assa et al. | |
| 2006/0203246 A1 | 9/2006 | Nakajima et al. | |
| 2007/0070805 A1 | 3/2007 | Myhrberg et al. | |
| 2007/0132828 A1 | 6/2007 | Ishida et al. | |
| 2007/0182808 A1 | 8/2007 | Stiblert et al. | |
| 2007/0188591 A1 | 8/2007 | Sandstrom | |
| 2008/0199068 A1 | 8/2008 | Duquette et al. | |
| 2009/0009842 A1 | 1/2009 | Destain et al. | |
| 2009/0246709 A1 * | 10/2009 | Nakasugi | B82Y 10/00 430/319 |
| 2010/0033698 A1 | 2/2010 | Sewell | |
| 2010/0060973 A1 | 3/2010 | Olaya et al. | |
| 2010/0118107 A1 | 5/2010 | Peregrym et al. | |
| 2010/0141732 A1 | 6/2010 | Sasaki et al. | |
| 2010/0142757 A1 | 6/2010 | Sandstrom et al. | |
| 2010/0208329 A1 | 8/2010 | Sandstrom et al. | |
| 2010/0314750 A1 * | 12/2010 | Bhate | B23K 26/0084 257/730 |
| 2011/0242514 A1 | 10/2011 | Sandstrom | |
| 2012/0140193 A1 | 6/2012 | Chiu et al. | |
| 2012/0149135 A1 | 6/2012 | Sugimura et al. | |
| 2012/0170240 A1 | 7/2012 | Tanaka | |
| 2012/0269972 A1 | 10/2012 | Khusnatdinov et al. | |
| 2012/0287357 A1 | 11/2012 | Misaki | |
| 2012/0299159 A1 * | 11/2012 | Chen | G03F 7/70625 257/620 |
| 2012/0302051 A1 | 11/2012 | Matsuno et al. | |
| 2012/0307226 A1 | 12/2012 | Maeda | |
| 2012/0313236 A1 | 12/2012 | Wakiyama et al. | |
| 2013/0001753 A1 | 1/2013 | Kanamitsu et al. | |
| 2013/0017378 A1 | 1/2013 | Doytcheva et al. | |
| 2013/0147066 A1 * | 6/2013 | Cheng | H01L 22/12 257/797 |
| 2014/0186753 A1 * | 7/2014 | Okamura | G03F 1/24 430/5 |
| 2014/0272685 A1 * | 9/2014 | Sandstrom | G03F 7/70425 430/5 |

FOREIGN PATENT DOCUMENTS

| | | | |
|---|---|---|---|
| EP | 1582928 A1 | 10/2005 | |
| EP | 1645657 A1 | 4/2006 | |
| JP | 60-227988 A | 11/1985 | |
| JP | 0772401 A | 3/1995 | |
| JP | 7101032 A | 4/1995 | |
| JP | 08327996 A * | 12/1996 | |
| JP | 927447 A | 1/1997 | |
| JP | H10-300447 A | 11/1998 | |
| JP | 2001523167 A | 11/2001 | |
| JP | 2001524893 A | 12/2001 | |
| JP | 2002311597 A | 10/2002 | |
| JP | 2002543607 A | 12/2002 | |
| JP | 2003195470 A | 7/2003 | |
| JP | 2004175078 A | 6/2004 | |
| JP | 2004191985 A | 7/2004 | |
| JP | 2004524706 A | 8/2004 | |
| JP | 2004351938 A | 12/2004 | |
| JP | 2005043555 A | 2/2005 | |
| JP | 2005055524 A | 3/2005 | |
| JP | 2005233869 A | 9/2005 | |
| JP | 4501798 B2 | 7/2010 | |
| KR | 2006016281 A * | 2/2006 | H01L 21/027 |
| WO | 9006033 A2 | 5/1990 | |
| WO | 9850196 A1 | 11/1998 | |
| WO | 9852345 A1 | 11/1998 | |
| WO | 0062324 A2 | 10/2000 | |
| WO | 0067291 A2 | 11/2000 | |
| WO | 02082598 A1 | 10/2002 | |
| WO | 03081966 A2 | 10/2003 | |
| WO | 2005007927 A1 | 1/2005 | |
| WO | 2005013006 A1 | 2/2005 | |
| WO | 2010131239 A1 | 11/2010 | |

OTHER PUBLICATIONS

Eran Elizur et al., "Printing Methods for Flat-Panel Display Manufacturing" Journal of Graphic Technology 1.2, Aug. 2003.

International Preliminary Report on Patentability dated Aug. 19, 2008 for International Application No. PCT/EP2007/001725.

International Search Report and Written Opinion mailed Aug. 3, 2012 in PCT/EP2011/072140, 10pp.

(56) References Cited

OTHER PUBLICATIONS

International Search Report dated Sep. 19, 2008 from corresponding International App. No. PCT/IB2008/001280.
International Search Report from corresponding International Application No. PCT/EP2014/054748; Oct. 27, 2014; 3 pgs.
Japanese Office Action dated Aug. 30, 2011, issued in Japanese Patent Application No. 2008-537640.
Japanese Office Action dated Aug. 30, 2011, issued in Japanese Patent Application No. 2008-537641.
Sandstrom, Tor et al., "Pattern Generation with SLM Imaging", 21st Annual BACUS Symposium on Photomask Technology, Proceedings of SPIE vol. 4562, p. 38-44, 2002.
Tanaguchi, Kazutaka et al. A MURA Detection Method Considering Human Vision Perception, in Transactions of the Institute of ElectricalEngineers of Japan, vol. 126, No. 11, p. 1539-1548, 2006.
U.S. Office Action from related U.S. Appl. No. 11/586,612; dated May 3, 2011; 7 pgs.
U.S. Office Action from related U.S. Appl. No. 11/586,612; dated Nov. 1, 2010; 8 pgs.
U.S. Office Action from related U.S. Appl. No. 11/586,612; dated Sep. 28, 2011; 8 pgs.
U.S. Office Action from related U.S. Appl. No. 11/711,895; dated May 10, 2011; 18 pgs.
U.S. Office Action from related U.S. Appl. No. 12/805,708; dated Sep. 29, 2011; 7 pgs.
Video Electronics Standards Association (VESA), "Flat Panel Display Measurements Standard (FPDM)", Version 2.0 available online at http://www.vesa.org/public/Fpdm2/FPDMUPDT.pdf. Accessed Nov. 15, 2007.

\* cited by examiner

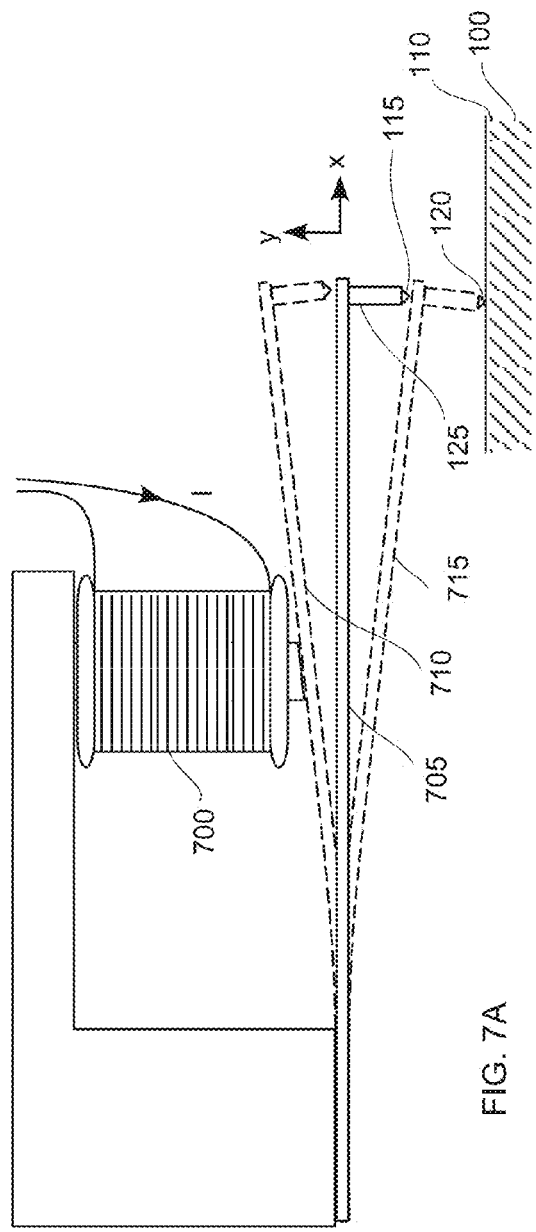
FIG. 7A
FIG. 7B
FIG. 7C

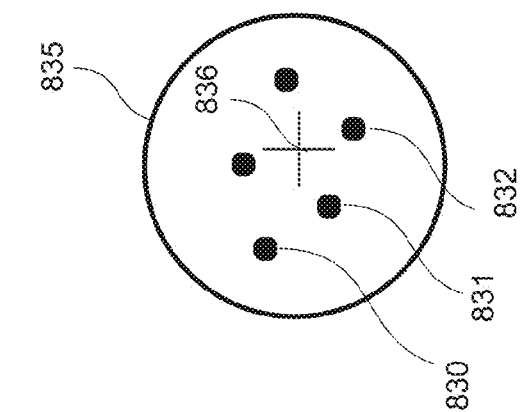
FIG. 8D
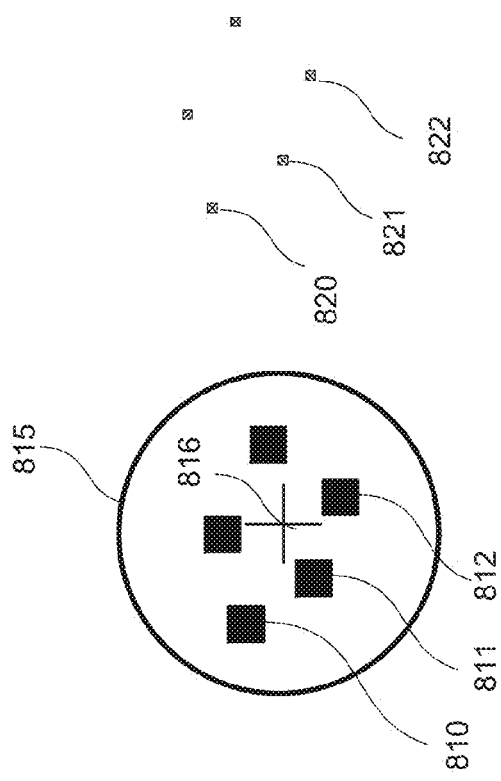
FIG. 8C
FIG. 8B
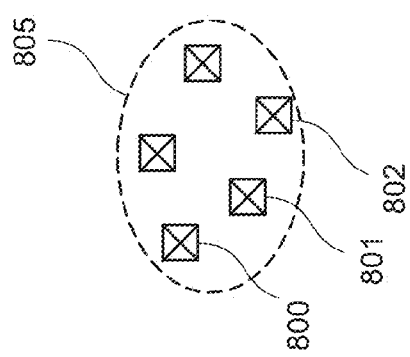
FIG. 8A

Mechanical Engineering

Mechanical Engineering

Laser marking of the surface or a film on the surface

Deposition of particles, liquids or films on top of the surface, e.g. ink-jetting

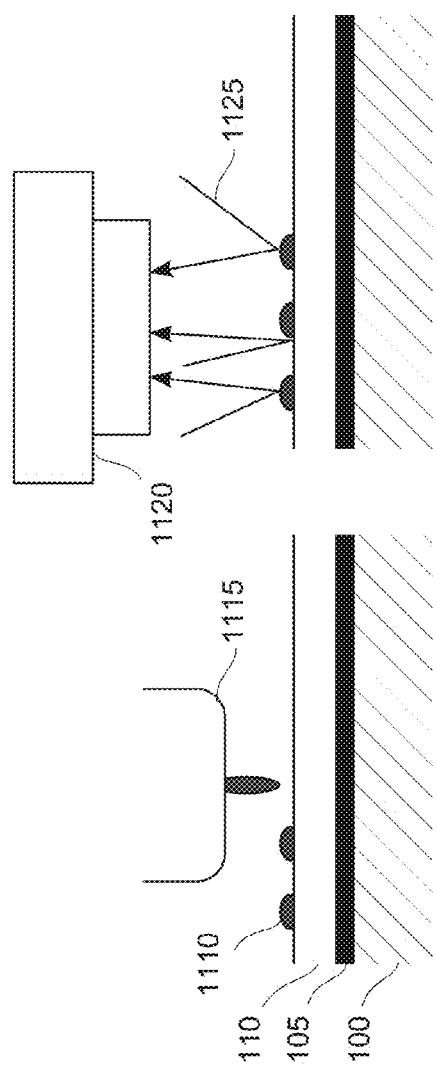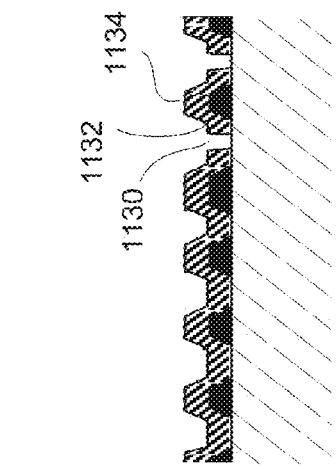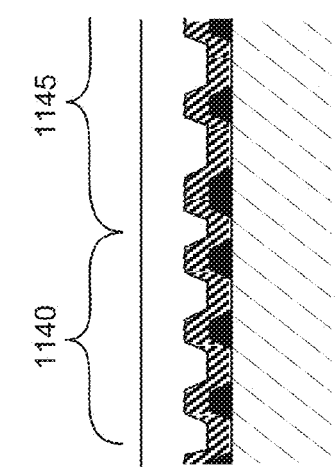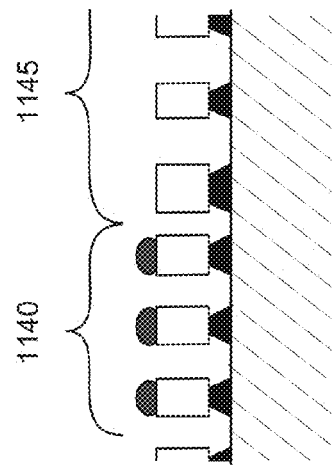
FIG. 11A
FIG. 11B
FIG. 11C
FIG. 11D
FIG. 11E
FIG. 11F

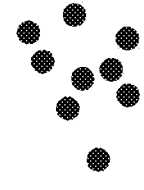
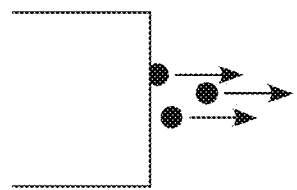
FIG. 12E
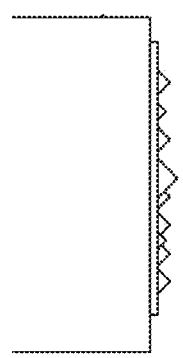
FIG. 12D
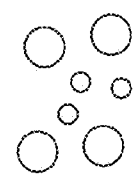
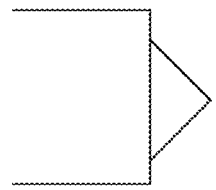
FIG. 12C
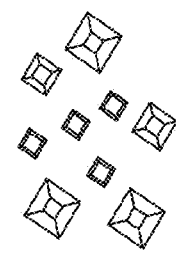
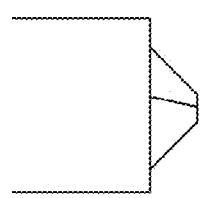
FIG. 12B
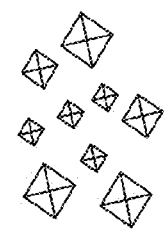
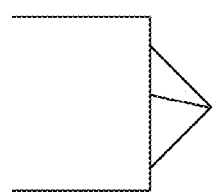
FIG. 12A

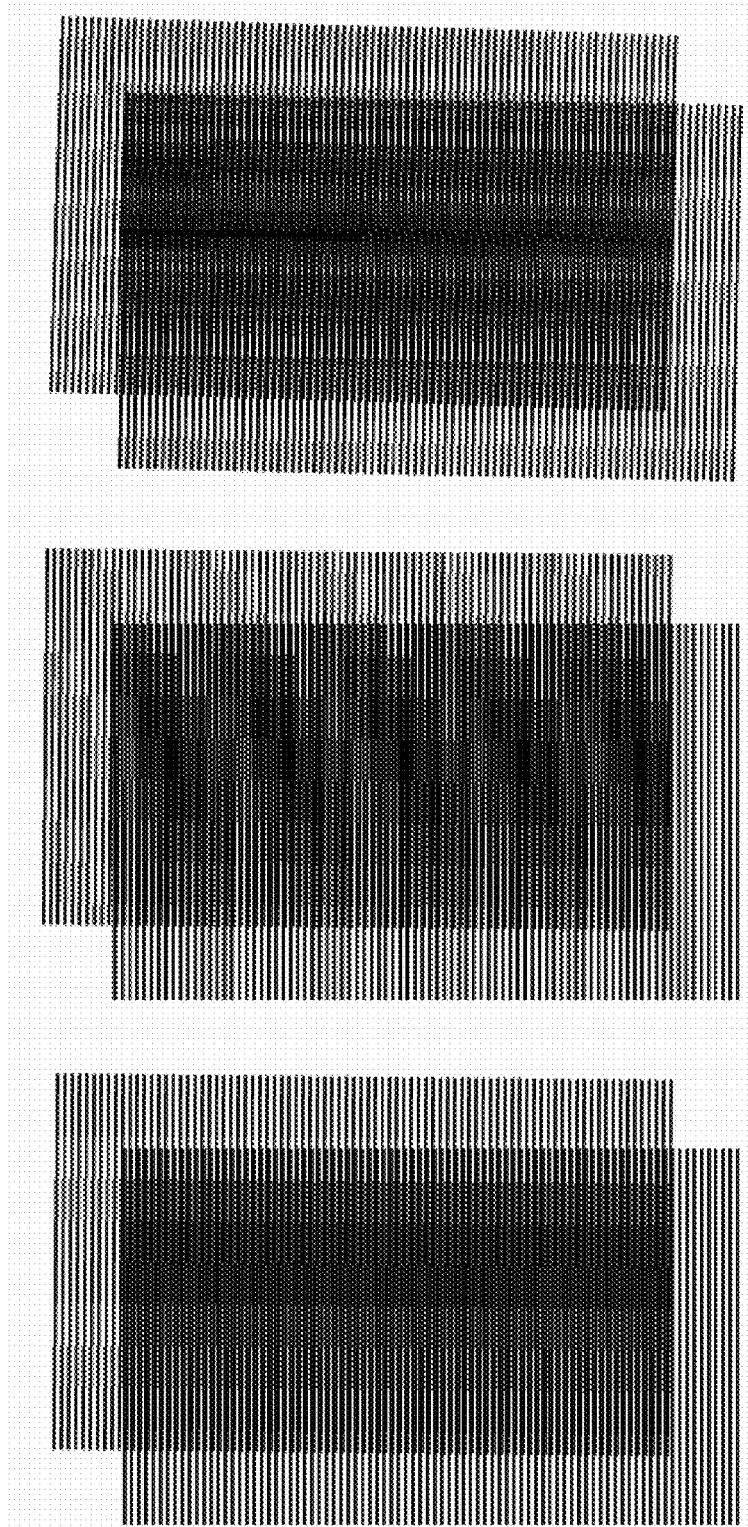

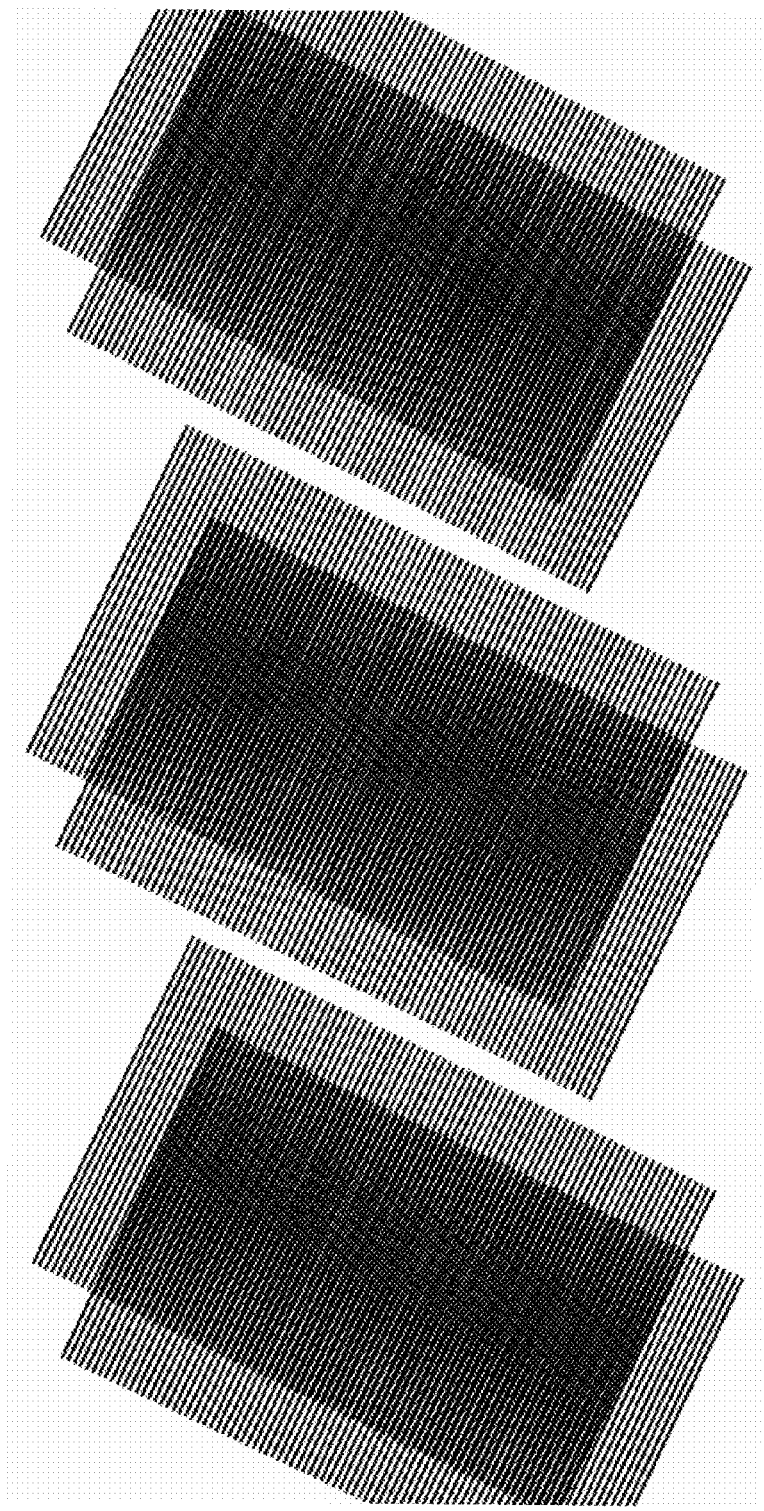

MECHANICALLY PRODUCED ALIGNMENT FIDUCIAL METHOD AND DEVICE

RELATED APPLICATION

This application claims the benefit of U.S. Provisional Application No. 61/777,469, filed 12 Mar. 2013 (MLSE 1138-1, P00404PR), which is incorporated by reference.

This application is related to U.S. Pat. No. 8,160,351 entitled "METHOD AND APPARATUS FOR MURA DETECTION AND METROLOGY" (MLSE 1078-2, P00314) and U.S. Pat. No. 7,411,651 entitled "PSM ALIGNMENT METHOD AND DEVICE" (MLSE 1042-2, P00183). It is also related to U.S. patent application Ser. No. 13/314,063 entitled "CRISS-CROSS WRITING STRATEGY" (MLSE 1118-2, P00377) and Ser. No. 11/586,614 entitled "WRITING APPARATUSES AND METHODS" (HDP drum) by the same inventor. It is further related to U.S. Provisional Application entitled "METHOD AND DEVICE FOR WRITING PHOTOMASKS WITH REDUCED MURA ERRORS" (MLSE 1140-1, P) by the same inventor. The related applications are incorporated by reference.

BACKGROUND

The technology disclosed relates to methods and systems that can be used to reduce visible artifacts know as mura. In particular, it relates to producing alignment marks by physically modifying appearance of a layer of exposure or radiation sensitive material on a workpiece, then using those alignment marks or transferred direct or inverted images of those marks to realign a writing coordinate system between exposure writing passes, following physical movement of the workpiece within the writing system. The physical modifications described include mechanically pressing a mark into the layer, using a laser to ash or ablate the layer, or applying an ink or other substance to the surface of the laser.

Prior alignment systems often have involved precisely placed marks added to substrates by a substrate manufacturer, such as holes drilled in the substrates. These marks would need to be detected through one or more layers of exposure sensitive and other materials applied over the mask substrate. A wide range of mark types added to reticles, masks and other workpieces have been described. Typically alignment marks have been added lithographically in the first layer exposed onto the substrates. A variety of optics for alignment have also been described.

An opportunity arises to supply better alignment systems for writing small features, especially better alignment systems for large area masks. Better masks that produce less visible artifacts may result.

SUMMARY

Again, the technology disclosed relates to methods and systems that can be used to reduce visible artifacts know as mura. In particular, it relates to producing alignment marks by physically modifying appearance of a layer of exposure or radiation sensitive material on a workpiece, then using those alignment marks or transferred direct or inverted images of those marks to realign a writing coordinate system between exposure writing passes, following physical movement of the workpiece within the writing system. The physical modifications described include mechanically pressing a mark into the layer, using a laser to ash or ablate the layer, or applying an ink or other substance to the surface of the laser. Particular aspects of the technology disclosed are described in the claims, specification and drawings.

BRIEF DESCRIPTION OF THE DRAWINGS

FIGS. 7A-C show a conceptual device for administering a single hit with the indentation tool and with predetermined impact energy.

FIG. 8 shows a group of fiducials at various steps during the process, FIG. 8A the indentation in the resist, FIG. 8B the optical image in FIG. 3, FIG. 8C shows the indentation in the underlying film before the etching, and FIG. 8D the optical image of the etched fiducials in FIG. 5.

FIG. 11A-F show an example process based on additive fiducials which transfers the formed to underlying layers by means of shadowing during exposure of the resist, development of the resist and etching.

FIG. 12 shows several examples of fiducials the physically modifying the surface of an exposure sensitive layer. FIGS. 12A-D show examples of indentation with different tools. FIG. 12E shows a fiducial formed by an example additive method, e.g. jetting, dusting with particles, laser induced forward transfer, etc.

FIGS. 14A-C conceptually illustrate the problem of mura, which produces visually perceptible patterns over large areas from small systematic errors, often related to quantization or grid snap.

FIG. 16A-C conceptually illustrate significant attenuation of visually perceptible patterns by significant rotation of the writing grid relative to the feature geometry.

DETAILED DESCRIPTION

Figure 1:
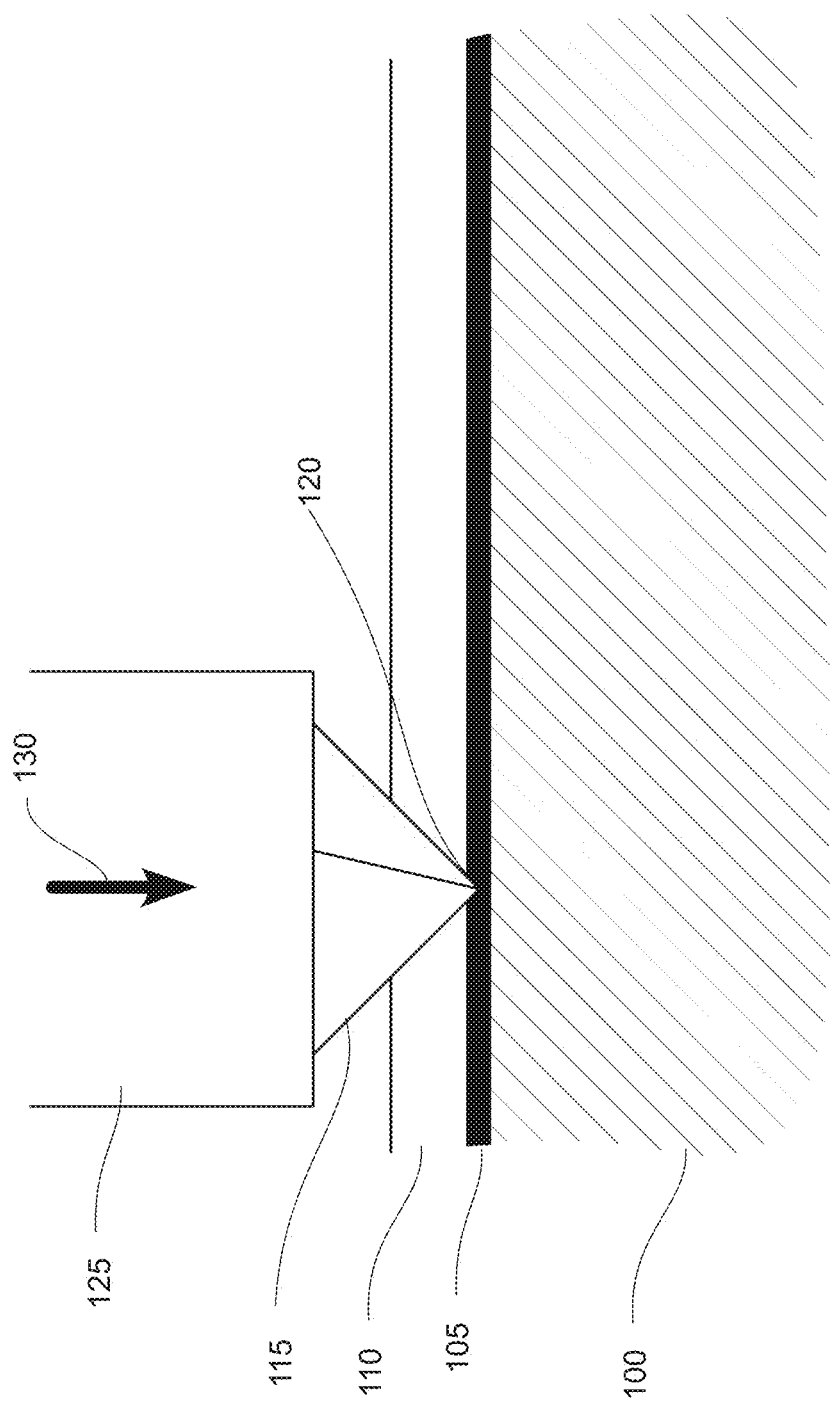
FIG. 1 shows mechanical indentation of a resist-coated surface, the indentation being deep enough to reach into the underlying material.

The following detailed description is made with reference to the figures. Preferred embodiments are described to illustrate the technology disclosed, not to limit its scope, which is defined by the claims. Those of ordinary skill in the art will recognize a variety of equivalent variations on the description that follows.

The technology disclosed uses dry methods to form optically visible fiducials in or on exposure sensitive layer formed over a workpiece. These dry methods can alternatively be referred to as physically modifying exposure sensitive layer or as mechanically modifying a layer. The layer can alternatively be referred to as radiation sensitive, such as a layer of resist.

In some implementations, development steps applied to the exposure sensitive layer cause transfer of optically visible fiducials to an opaque or phase shifting layer (generally referred to as a first patterning layer) underlying the exposure sensitive layer. For instance, wet etching of the exposure sensitive layer to create a pattern by removing part of the opaque layer can positively transfer a fiducial created in resist to a chrome layer under resist, when the fiducial exposes the chrome to the etchant. In another example, wet etching of the exposure sensitive layer can create an inverse transfer of a group of fiducials that are created by jetting ink onto resist, exposing the resist, and etching into chrome in the space between ink marks. Both positive and negative resist can be used with slight modifications to the process.

Optically visible fiducials in or on the exposure sensitive layer can be detected when writing a second pattern after the fiducials have been transferred into an opaque layer, such as chrome or to the phase shifting layer, whether transferred directly or inversely. Detection of and alignment to fiducials is useful, for instance, when a first patterning step is followed by applying a second resist layer. The transferred optically visible fiducials are used to align a second pattern to the first one. With masks or reticles, this can be useful when the mask includes opaque regions bordered by partially opaque (grey) regions or when phase shifting features are combined with opaque features. It is likely to have other practical uses as well.

Optically visible fiducials in or on the exposure sensitive layer can be detected without transfer and effectively used when writing a single layer with two exposures separated by a mechanical rotation of the workpiece. For instance, a pattern can be written with the workpiece placed that a first oblique angle to the desired pattern. The workpiece can be rotated in preparation for writing at a second oblique angle to the desired pattern. The optically visible fiducials in or on the exposure sensitive layer can be used to align the first and second writing passes accurately, following physical rotation of the workpiece. The workpiece on a stage can be rotated at an angle of five degrees, 10 degrees, at least 10 degrees, or 10 to 45 to a primary or secondary axis of features in the desired pattern.

The optically visible fiducials can be applied at various times after the exposure sensitive layer is applied and before the workpiece is removed from the patterning device. For instance, if mask blanks arrive at a patterning shop with resist already applied, the optically visible fiducials can be applied by the supplier of the blanks. Alternatively, marks can be applied in a workstation adjacent to the patterning device immediately before the first writing pass. Or, a tool for creating the optically visible fiducials can be incorporated into the writing device, so that the fiducials are created before, during or after the first writing pass. The position of the optically visible fiducials is measured relative to the pattern written in the first writing pass. The position of the fiducials relative to the workpiece being patterned is not critical; the position relative to the pattern can readily be used for alignment between writing passes, both for writing passes in a successive layers and for multiple writing passes on a single layer, with a mechanical reorientation in the workpiece between writing passes.

A variety of methods are available for forming optically visible fiducials by physical modification of the surface of the photoresist layer, by laser ablation, deposition of a fine pattern by dusting, spraying, ink-jetting or similar techniques, or by mechanical indentation. Mechanical indentation gives small marks with high optical contrast and is flexible since indentation can be made in the photoresist, in other polymer films and etch masks, through the photoresist into the film to be patterned, or into the substrate. An embodiment is the writing of phase-shift or half-tone masks where a first film, e.g. black chrome, is patterned and a second attenuated layer is deposited on top of the patterned chrome and patterned with a second pattern, different but with very high required overlay accuracy.

Mechanical indentation, e.g. by a sharp diamond pyramid similar to a Rockwell hardness tester, makes a mark in the photoresist which can be easily seen with an optical sensor. For redundancy and error averaging a fiducial can consist of a number of indentation marks, e.g. less than 10, less than 100, more than 5, more than 20. The optical sensor can be a camera, a microscope, a line scan camera or the reflection of a writing beam in the optical writer.

If the indentation is done with suitable force or impact energy the indentation can go through the photoresist and into the underlying film, e.g. chrome. The metal is hard and the pressure around the tip of the indenter becomes very high so it squeezes the photoresist away from the tip and makes a hard contact between the tip and the chrome. When the tip is retracted it leaves an indentation in the resist, a small indentation in the chrome and an opening through the resist to the chrome metal. Several figures illustrate pressing various shapes of marks into resist. Other figures illustrate jetting ink or another substance onto resist.

The technology disclosed further includes methods and writing systems for forming, by dry methods, optically visible fiducials in an exposure sensitive layer of the workpiece and measuring their positions on a workpiece. A first exposure pattern is formed either before or after the fiducials are created. The position of the fiducials are re-measured when the workpiece is reloaded for a second exposure, which can be to the same layer or to a second layer. The measured position of the fiducials are used to align the second exposure. Typically, machine errors or biases enter identically in both exposures and do not give rise to overlay errors or misalignment. If there is a constant position error between measuring and writing, e.g. a position offset, this error goes into the overlay error between the layers in the prior used method. In the technology disclosed, the constant error goes identically into both writing operations, thereby reducing differential errors. If there is a non-constant error it is also reduced since the procedure to measure fiducials and write is identical in both layers, which minimizes the differential influence of thermal drift, memory effects, and similar systematic but unknown effects.

The technology disclosed also includes methods and writing systems including a measurement system for forming, by dry methods, first optically visible fiducials on the workpiece and measuring their positions. Following exposure of a first layer, the fiducials are transferred to create second optically visible fiducials after chemical processing. The positions of the second fiducials are re-measured and the measured positions are used to align the second layer.

The transferred fiducials can be directly or inversely transferred, depending on how they were formed. Typically, machine errors or biases enter identically in both exposures and do not give rise to overlay errors or misalignment. An example situation is writing two layers with rotation of the grid between the writing operations, another is making a photomask where first a chrome layer is patterned and processed, a second layer such as a semitransparent layer or a phase-shifting layer is deposited, new photoresist is deposited and the second layer is patterned.

After patterning, the exposure sensitive layer of the mask is developed forming a resist pattern. The first patterning layer under the resist, such as chrome, is etched through the openings in the resist. The etching process will also etch the chrome through the indented opening, making an intentionally created pinhole. Typically this makes an etched hole in the chrome film somewhat bigger and rounder than the opening in the resist, due to undercutting. These etched holes can be used as fiducials in later patterning steps.

A layer of absorbing or phase-shifting material is deposited on the patterned chrome and it will conform to the etched surface of the chrome. Even if the second film is opaque in reflection, the outer surface will mirror the shape of the chrome surface and give optical visibility to the features in the chrome film beneath it. Therefore, the fiducials will be visible and the second layer patterning can use them for alignment.

The technology disclosed yet further includes methods and writing systems for writing a pattern in a plurality of exposure passes with the workpiece being physically rotated between exposures of a single exposure sensitive layer. The fiducials can be used to align the writing passes without chemical development or transfer from resist to chrome.

Applying the technology disclosed, a pattern can be written with high fidelity and suppression of signatures from the writer itself. The pattern is written several times (passes), at least twice, with the workpiece physically rotated at least once between writing passes. Applying the technology disclosed, fiducials can be formed before the writing starts (or immediately before the rotation) and used to align the passes, accurately but with an extremely precise rotation of the passes.

The innovative fiducials can be made very compact, so that the area assigned to them is small. In contrast to prior art alignment the fiducials need not be formed with any position accuracy. Their function is only to allow the coordinate systems of the two writing passes to be aligned to each other. The geometric precision within a pass is provided by the stage of the writing system. Therefore the fiducials can be formed at a station outside the writer. For mechanical indentation is preferable to use a controlled impact system. The indenter may be attached to a small mass at the end of a spring. The spring is tensioned and released and the indenter shoots out to hit the surface once, bounce back and will not hit again since the spring has suitable damping. The movement can be axial with a piezo or electromagnetic actuator or lateral with a leaf spring with sideways actuation.

Applying the technology disclosed, the problem of reducing errors between two optically exposed pattern layers on the same workpiece with a physical movement of the workpiece between the layers can be addressed by forming by dry methods optically visible fiducials on the workpiece, measuring their positions before removing the workpiece from the writer after exposure of the first layer, and re-measuring their positions when the workpiece is loaded for additional exposure writing, for instance, of a second layer. Using the measured positions to align the second layer, many machine errors enter identically in both layers and do not give rise to overlay errors.

Similarly, the problem of reducing errors between two optically exposed pattern layers on the same workpiece with chemical processing of the workpiece between writing the layers can be addressed by forming by dry methods first optically visible fiducials on the workpiece and measure their positions while the workpiece is being loaded into the writer for exposure of the first layer, transferring the first optically visible fiducials to second optically visible fiducials after the chemical processing, and re-measuring the positions when the workpiece is loaded for writing of the second layer. Using the measured positions to align the second layer, the same or inverse structures are visible during writing of both layers and many errors or biases related to the fiducials, the position measurement system and writing system enter identically in both layers. Identical errors or biases do not give rise to overlay errors.

Turning then to the figures, FIG. 1 shows mechanical indentation of a resist-coated surface, the indentation being deep enough to reach into the underlying material. Substrate 100 is overlaid by an first patterning material 105, typically chrome. The first patterning layer 105 is overlaid by an exposure or radiation sensitive layer 110. A tip 115 is used to create a mechanical indentation at least in the exposure sensitive layer 110. In this figure, the end of the tip 120 has penetrated through the exposure sensitive layer to the first patterning layer 105. The tip is mounted on a ram 125 and a force 130 is applied to cause the mechanical indentation. While the tip in this figure is illustrated as a conical or for pyramidal shape, a more cylindrical shape also could be used.

Figure 2:
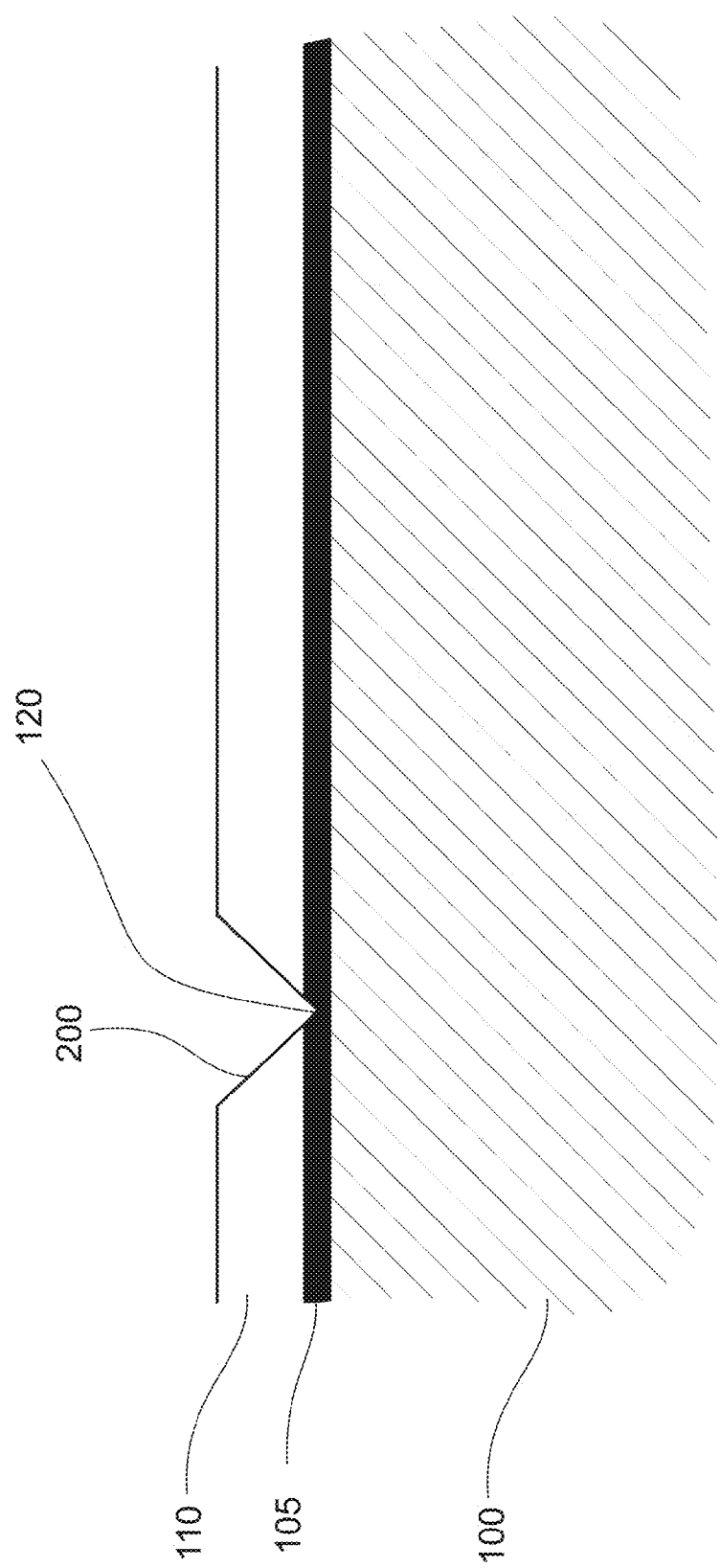
FIG. 2 shows the indentation after the tool has been removed

FIG. 2 shows the indentation after the tool has been removed. The mechanical indentation 200 corresponds to the shape of the tip 115. This figure shows a mechanical indentation that extends through the exposure sensitive layer 110 into the first patterning layer 115 leaving an indentation 120. The mechanical indentation allows wet etching to reach the first patterning layer. It may not be necessary because in indentation in the first patterning layer for the wet etching to be effective. A cylindrical shaped indentation, for instance, could sufficiently expose the first patterning layer to wet etching. A cylindrical shaped indentation may be more favorable if dry etching is used instead of wet etching.

Figure 3:
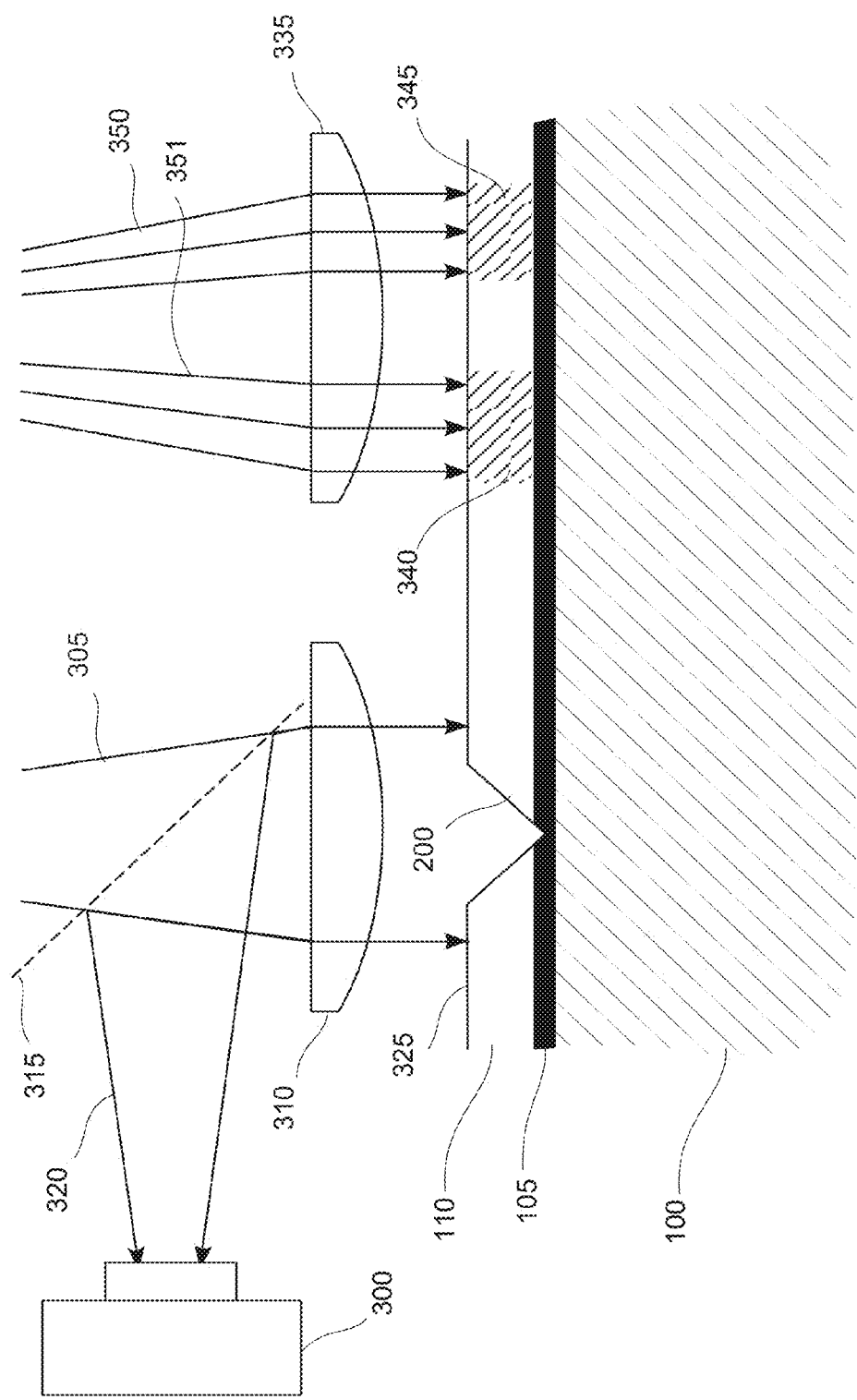
FIG. 3 shows how an optical detector or camera 300 can see and measure the position of the indentation 200. It also shows how the photoresist is exposed with a pattern 340 and 345.

FIG. 3 shows how an optical detector or camera 300 can see and measure the position of the indentation 200. It also shows how the photoresist is exposed with a pattern 340 and 345. The optics 310, 335 may be the same for both measuring the position of the alignment mark 200 and exposing the pattern 340, 345. When used for measuring the position of the indentation 200, illumination 305 returned from the surface 325 of the radiation sensitive layer 110 is directed by a beam splitter 315 along the path 320 to camera 300. When used for writing a pattern 340, 345, modulated radiation 350, 351 is focused through the optics 335. Using the same optics for both measuring and writing positions the indentation 200 relative to the pattern 340, 345, in a first coordinate system.

Figure 4:
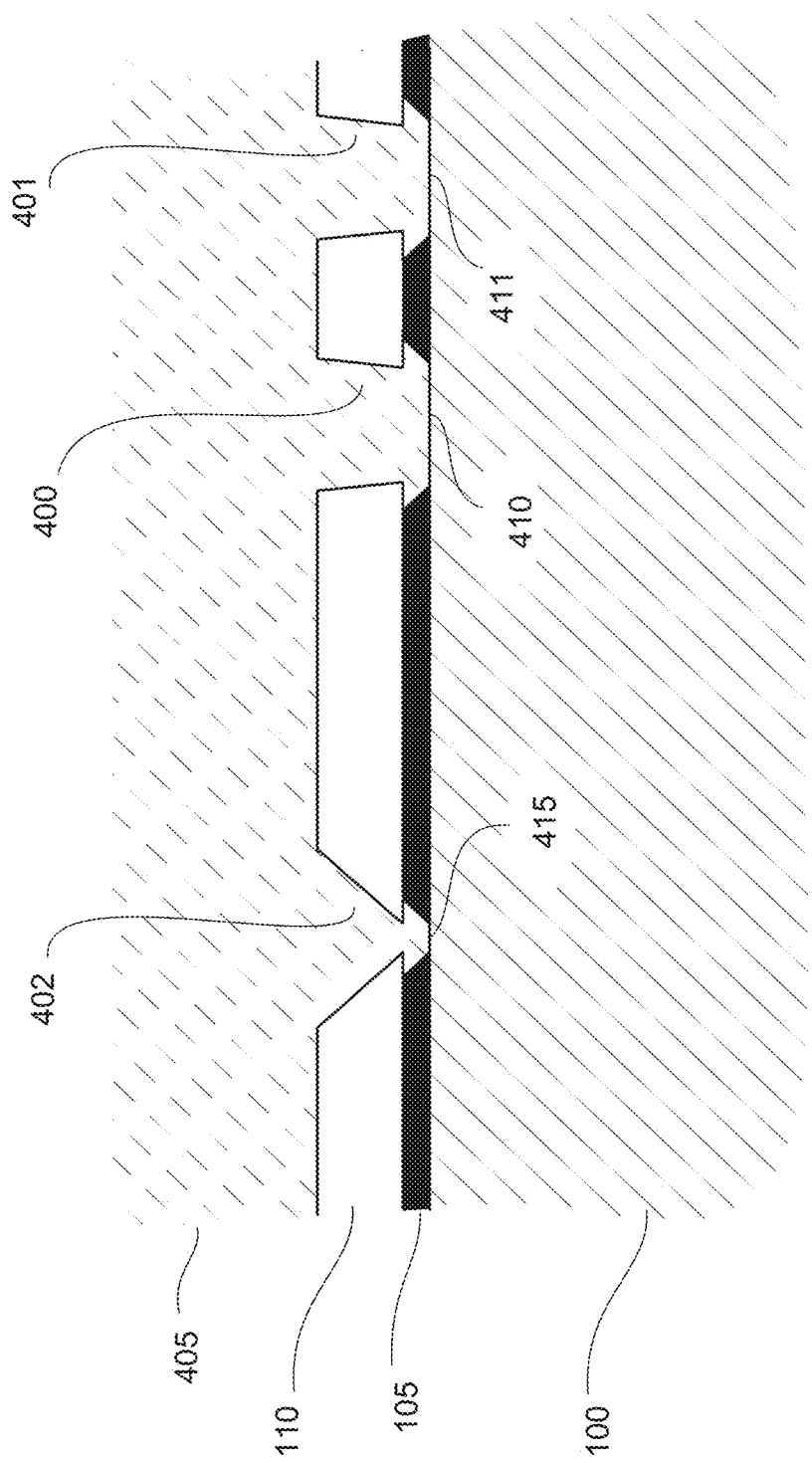
FIG. 4 shows the workpiece after development which has opened up the exposed areas and during etching where the etching medium 405 consumes the film 105 (e.g. the chrome film and opens up trenches where the resist has been exposed 410, 411 but also where the resist was indented 415.

FIG. 4 shows the workpiece after development. Development has etched away exposed areas 340, 345, leaving openings 400, 401. The etching also is removed part of the first patterning layer 410, 411 under the openings. Similarly, the wet etchant 405 will be carried 402 through the indentation to the first patterning layer 501 producing a transfer 415 of the fiducial into the first patterning layer where the resist was indented 402.

Figure 5:
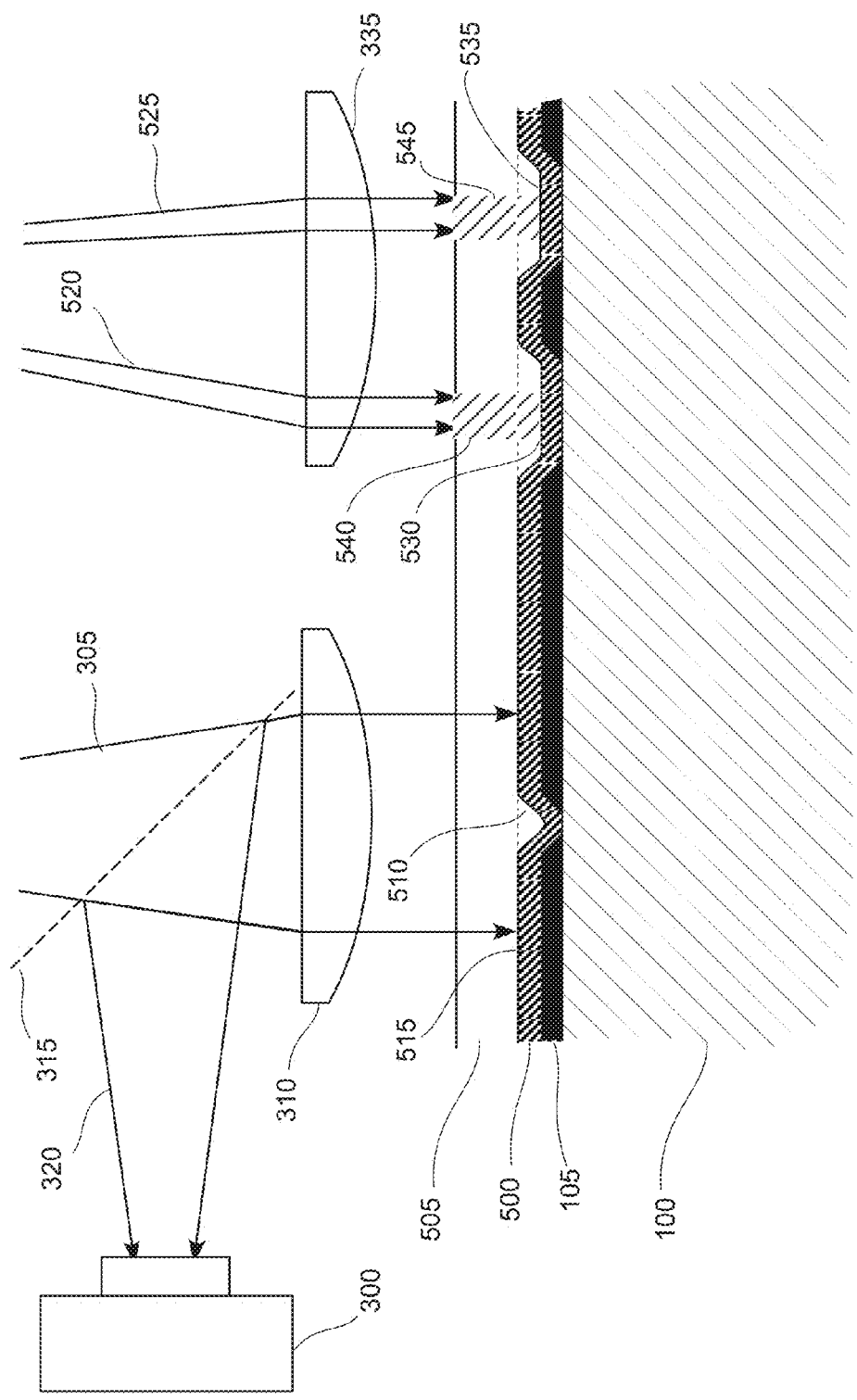
FIG. 5 the remaining resist has been stripped away, a second film 500 has been deposited and a second layer of photoresist 505. The camera 300 detects and measures the position of the fiducial transferred in to the chrome by the etching and the writing of the pattern of the second layer 530, 535 is done after alignment to the fiducials 510.

FIG. 5 a second film 500 deposited after the first resist layer was stripped away. A second layer of photoresist 505 is shown overlaying the second film 500. The surface of the second film 515 conforms to the first patterning layer 105. The surface conforms 510 to the indentation in the prior figures and also conforms 530, 535 to openings 410, 411 resulting from pattern exposure 340, 345. The camera 300 detects and measures the position of the fiducial. The writing of the pattern 540, 545 in the second resist layer is done after alignment to the fiducials 510, using modulated radiation 520, 525. The second film 500 could be a phase shifting layer, a partially absorbing layer or chrome over a shifter. In this example, exposing radiation can be used to image the fiducial, even if it exposes the resist layer 505 in the area of the fiducial 510.

Figure 6:
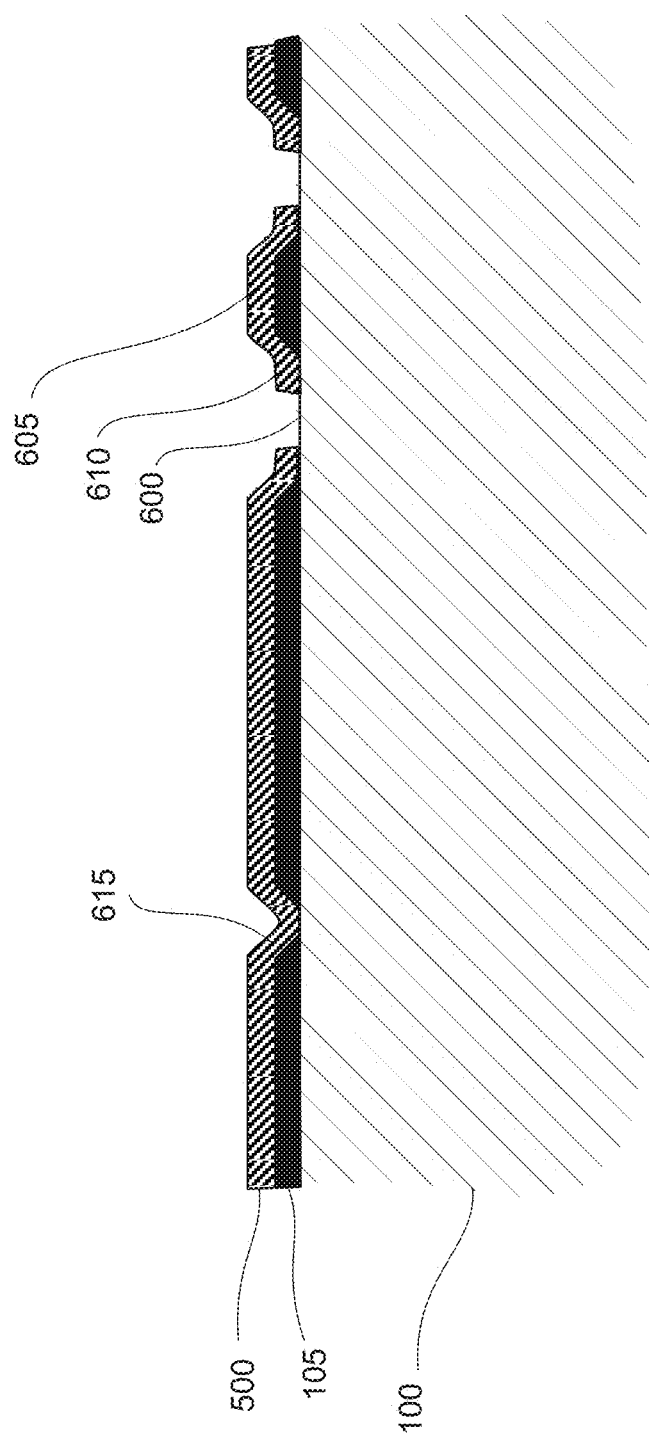
FIG. 6 shows two patterns with accurate overlay.

FIG. 6 depicts two patterning layers of a mask 500, 105 over a substrate 100. In this figure, the indentation 200 remains visible as an indentation 615 in the second patterning layer film 500. Openings in the second film 600 give the mask at least three transmission types, such as full transmission 600, partial transmission 610 and non-transmission 605, in the case of a partially opaque layer overlaying an opaque layer. The three transmission modes will, of course, be different if one or both of the patterning layers comprise phase shifting material.

FIG. 7A shows a conceptual device for administering a single hit with the indentation tool and with a known impact energy. Several of the features are familiar from prior figures, including the substrate 100, the exposure sensitive layer 110, the tip 115, the indentation 120 and the ram 125. In this figure, a leaf spring or similar material 705 is loaded with force 710 by a solenoid 700. When the solenoid is released, the RAM is carried to a position 715 that contacts the exposure sensitive layer 110. FIG. 7B shows a graph of current 720 used actually the solenoid and FIG. 7C shows displacement of the spring member 705. The actuating current 720 is depicted as a step function. The response of the arm 705 moves from the neutral position 732 a ready to fire position 735 to the contact position 740. Following contacts, there may be balanced 745. Measures may be taken to minimize the bounce.

FIG. 8 shows a group of fiducials at various steps during the process. FIG. 8A conceptually illustrates the indentation in the resist individual fiducials 800, 801, 802 form a group 805. FIG. 8B illustrates an optical image expected to result from the indentations. Corresponding to these individual fiducial indentations are individual images 810, 811, 812 in group 815. By measurement, a reference point 816 can be determined. FIG. 8C shows the indentation in the underlying first patterning layer before the etching. The impressions the first patterning layer 820, 821, 822, if any, have a smaller cross-section than the corresponding impressions in the any first exposure sensitive layer 800, 801, 802. FIG. 8D illustrates an optical image 830, 831, 832 of the fiducials transferred by etching, as depicted in FIG. 5. These transferred fiducials form a group 835 from which a reference point 836 can be determined.

Figure 9:
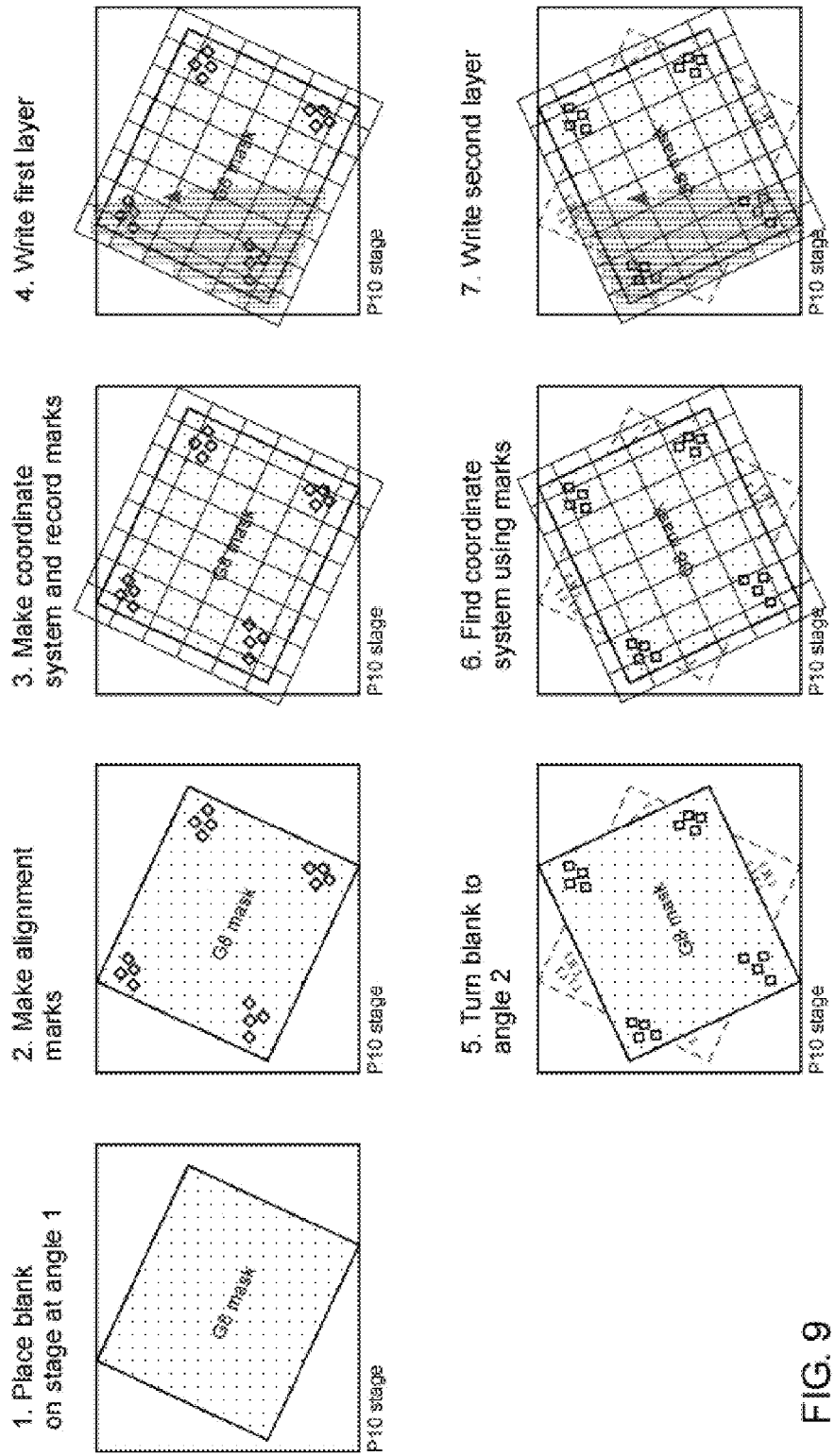
FIG. 9 shows oblique writing of a workpiece with two passes with different oblique angles.

FIG. 9 shows oblique writing of a workpiece with two passes with different oblique angles. In this implementation, a mask blank is rotated to produce different oblique angles. The storyboard shows seven steps. The first step is to place a blank, such as a G8 size mask on a stage in the first oblique angle. Because the mask is placed at an angle, the stage is larger than the mask, such as a P10 stage for a G8 mask. Step two is to make alignment marks on the mask. This step can be carried out, as described above, had a separate station after application of the radiation sensitive layer, or it can be carried out on the stage. Step three is to measure the position of the alignment marks and record their position relative to the first court system. Note that steps two and three can follow the first exposure in step four, if precautions are taken so that the formation of the alignment marks does not upset the position of the workpiece relative to the writing coordinate system. Step five involves turning the blank the second oblique angle. In step six, the alignment marks are located and measured. A second coordinate system is established or the first coordinate system is reoriented to facilitate alignment of a second exposure with the first exposure. Step seven involves writing a second exposure, which may be a second exposure of the same layer is in step four or may involve writing on a second layer of exposure sensitive material.

Figure 10A:
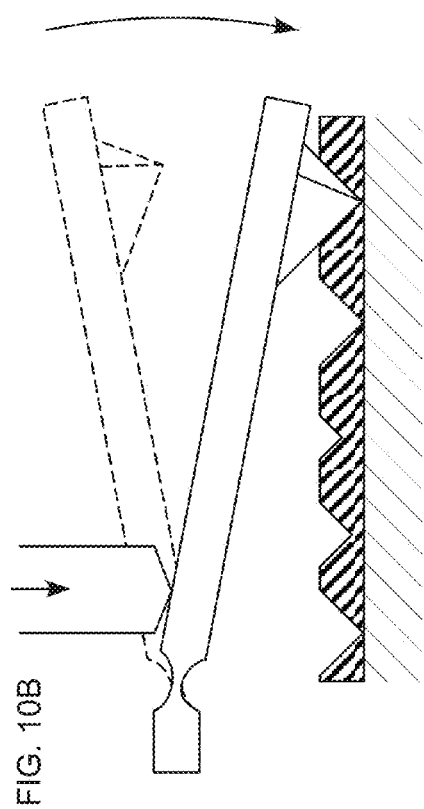
FIGS. 10A-D show several methods to form fiducials which are optically visible without chemical processing.
Figure 10B:
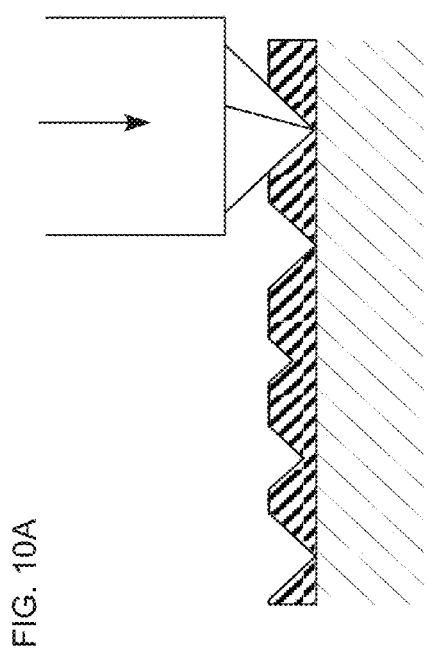
Figure 10C:
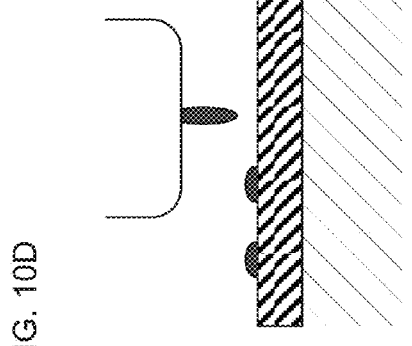
Figure 10D:
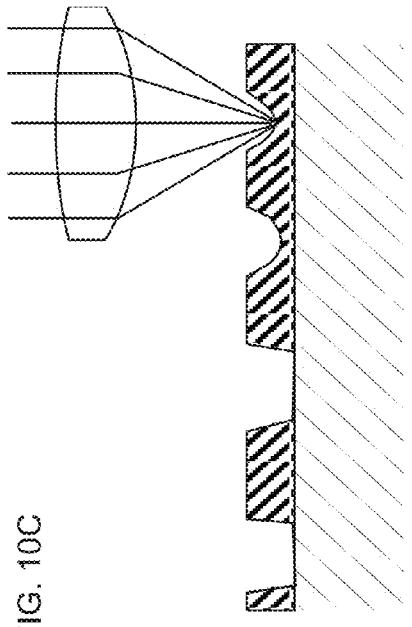

FIGS. 10A-10D show several methods to form fiducials which are optically visible without chemical processing. FIG. 10A illustrates use of a ram that strikes perpendicular to the substrate. An impulse, such as spring or a piezo electric actuator presses a point down through the radiation sensitive layer. FIG. 10B illustrates an alternative mechanical apparatus in which a ram strikes an arm causing a tip to press down through the radiation sensitive layer. FIG. 10C illustrates use of laser ashing, etching or ablation or other laser marking of the first pattern transfer layer or an exposure sensitive layer. FIG. 10D illustrates deposition of particles, liquids or films on a surface using a process such as ink jetting. The surface can be the surface of the radiation sensitive layer.

FIGS. 11A-11F shows an example process based on additive fiducials, with inverse transfer of the additive fiducials to underlying layers by means of shadowing during exposure of the resist, development of the resist and etching. In FIG. 11A, fiducials 1110 are applied to the surface using a device such as an inkjet head 1115. In FIG. 11B, before or after exposure, a camera 1120 can be used to record reflected light 1125 from the fiducials and record their position. While this figure depicts recording the position of the fiducials before exposure, it also could be done after exposure. In FIG. 11C, exposing radiation 1132 is used to create an inverse fiducial pattern 1137 between the additive fiducials 1110. In the same exposure step, modulated radiation 1130 is used to form a useful pattern 1135. In FIG. 11D, the exposed resistance developed and part of the first pattern layer removed, exposing the substrate. In the fiducial area, the un-patterned area 1140 corresponds to where the additive fiducials prevented exposure the resist. The remainder of the substrate 1145 is patterned using conventional methods. In FIG. 11E, a second patterning layer has been applied, conforming to etching of the first patterning layer. The second layer is conformal over both the fiducial area 1140 and the remainder of the substrate 1145. As explained above, conformal contours in the fiducial area can be detected and used to establish a coordinate system for a second exposure, for instance, to pattern a second patterning layer. FIG. 11F is similar to FIG. 6, showing three exposure regions 1130, 1132 and 1134. In these regions, respectively, there is no patterning layer, a second patterning layer, and a second patterning layer overlaying the first patterning layer.

FIG. 12 shows several examples of fiducials the physically modifying the surface of an exposure sensitive layer. FIGS. 12A-D show examples of indentation with different tools. FIG. 12E shows a fiducial formed by an example additive method, e.g. jetting, dusting with particles, laser induced forward transfer, etc.

Figure 13:
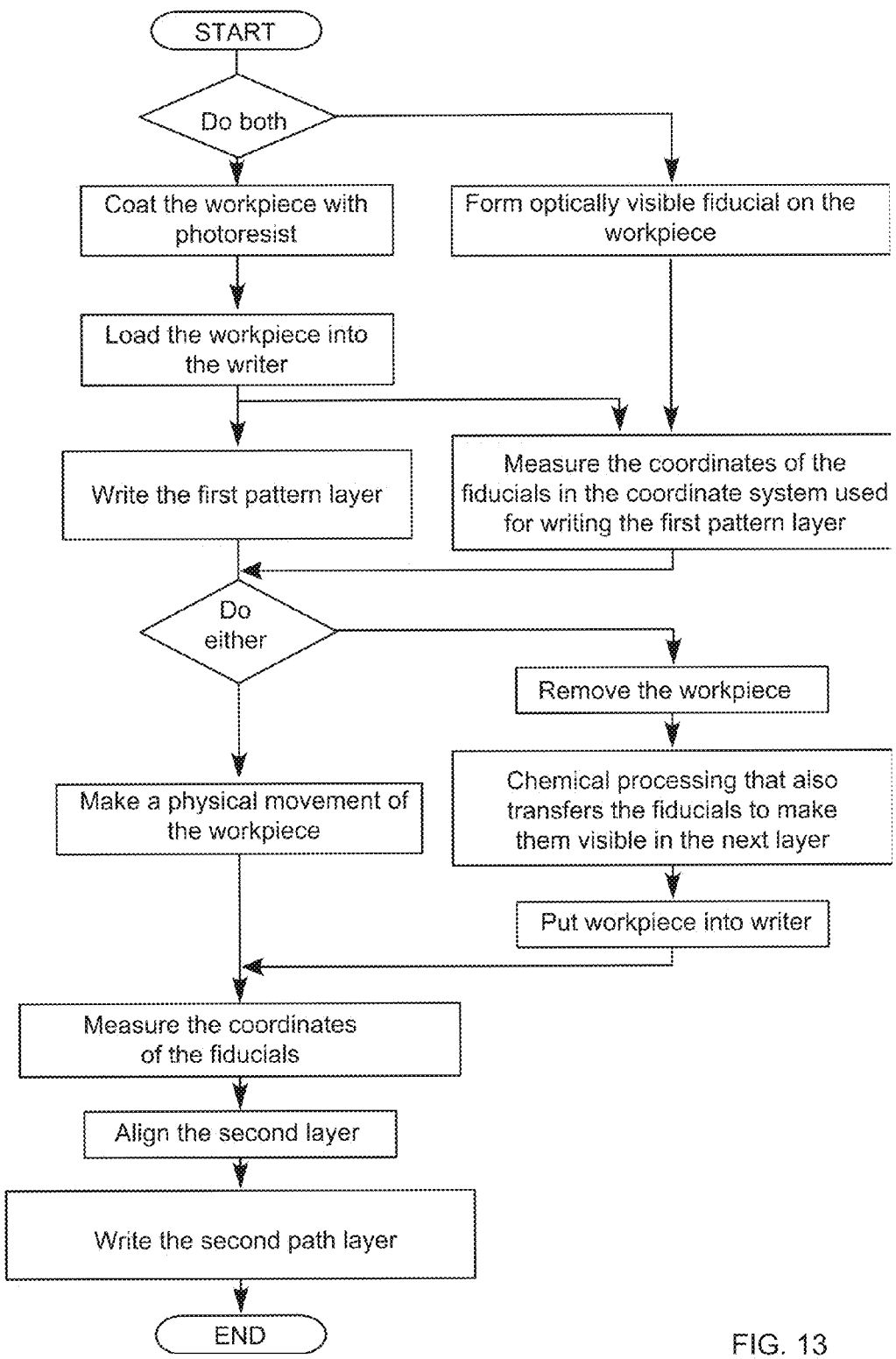
FIG. 13 shows a flow chart of an example process using the innovative method.

FIG. 13 shows a high level flow chart of example processes. In the top half of the flow chart, parallel paths preceded by "do both" indicate steps that can be performed in various orders. As explained above, optically visible fiducials can be formed before or after loading a workpiece into a writing system and writing the first pattern layer. Whatever the order of the steps, the position of the fiducials is recorded in the same coordinate system as used to write the first exposure. The fiducials do not need to be formed with precision, since they do not define the first coordinate system. The first coordinate system is defined by the precision stage and stage metrology of the writing system. The fiducials are used to convey the position of the first coordinate system from the first writing operation to the second writing operation, so that the second coordinate system can be accurately positioned relative to the first coordinate system. The first and second coordinate system may be aligned to coincide with high precision or they may be given a relative translation or rotation, also with high precision. Furthermore, when the positions of the fiducials are known in the first coordinate system the second coordinate system, which is generally defined by the stage metrology, can compensate for scale, orthogonality, and keystone and other distortions, so that it not only coincides with the first coordinate system, but becomes overlays it with high precision, possibly after a translation and/or rotation. This can be included in "aligning the second layer," as illustrated in FIG. 13.

The bottom half of the flow chart illustrates to alternative processes, which could but need not be combined. The left branch describes physical movement of the workpiece, such as the rotation illustrated by FIG. 9. The right branch involves both physical movement (removal of the workpiece) and chemical processing before the workpiece is returned to the writing system. The two paths rejoin for measurement of the coordinates of the fiducials, alignment of the second exposure to the first and writing a second exposure.

FIGS. 14A-14C conceptually illustrate the problem of mura, which produces visually perceptible patterns over large areas from small systematic errors, often related to quantization or grid snap. In FIG. 14A, the lower line set is rotated by 0.6 degrees relative to the upper line set. The results in visually perceptible banding, as the vertical lines move in and out of phase with one another. When the lines are aligned, or in phase, the pattern is light grey. When the lines are out of phase, a band appears. Patterning is more distinctive when the patterns with a small systematic error are magnified in FIG. 14B. Finally, FIG. 14C shows how the systematic error of misalignment is mitigated by writing both sets of lines rotated by one degree off vertical. At this orientation, the visual pattern shifts.

Figure 15A:
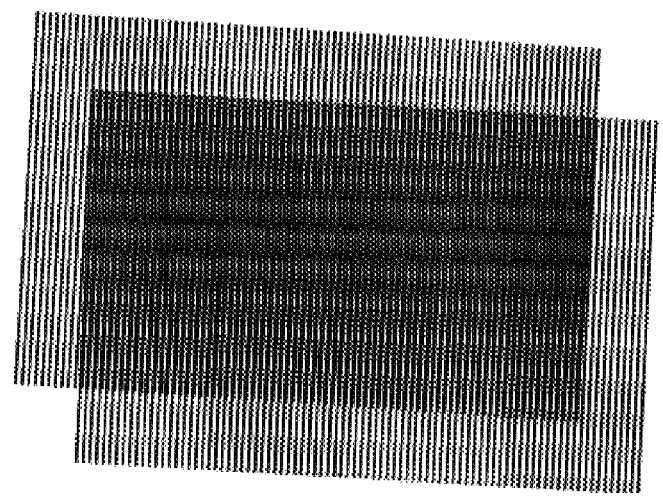
FIG. 15A-C conceptually illustrate how the visually perceptible patterns are impacted by a small rotation of the writing grid relative to the feature geometry of the pattern being written.
Figure 15B:
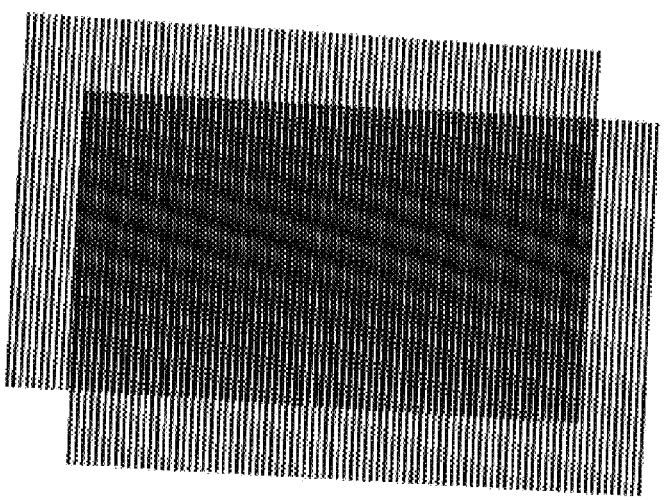
Figure 15C:
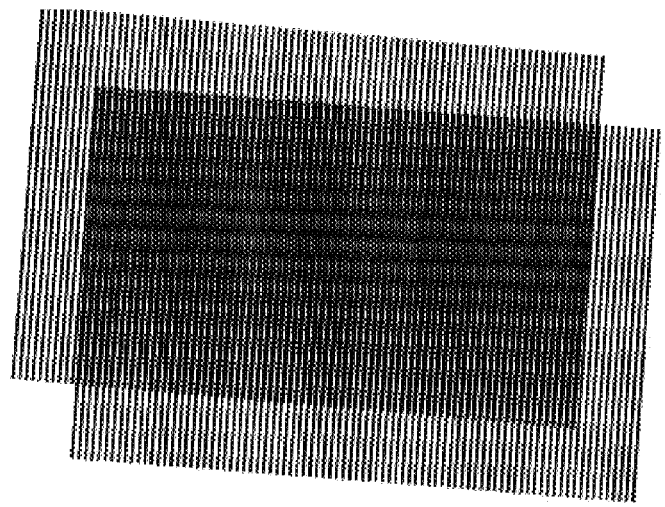

FIGS. 15A-15C conceptually illustrate how the visually perceptible patterns are impacted by a five degree rotation of the writing grid relative to the feature geometry of the pattern being written. Note that 15C repeats 15A. The pattern is finer and somewhat less likely to be perceptible.

FIGS. 16A-16C conceptually illustrate significant attenuation of visually perceptible patterns by a 25 degree rotation of the writing grid relative to the feature geometry.

These conceptual illustrations give the viewer a sense that small systematic errors can become perceptible. In fact, the human eye is a very sensitive detector of the presence of systematic errors, even if the errors are too small to identify or explain. The human eye detects so-called mura patterns even as diffraction patterns when the eye cannot see the spaces between lines. Given this sensitivity of visual perception, it is useful to apply measures that reduce systematic errors to scattered noise, instead of perceptible patterns.

Some Particular Implementations

The technology disclosed may be practiced as a method or system adapted to practice the method.

One implementation of the technology disclosed is a method of aligning a workpiece between two exposure patterning operations. This method includes forming fiducials by a dry method in or on an exposure sensitive layer on a workpiece. It further includes measuring and recording first position information of the fiducials in a first coordinate system used by a writing system to apply a first exposure to the workpiece. In conjunction with this method, the workpiece is physically moved and repositioned in the writing system, which requires further alignment. The method includes further measuring and recording second position information of the fiducials or of a transfer from the fiducials onto another layer of the workpiece and using the second position information to align a second coordinate system relative to the first coordinate system. The alignment includes translating and/or rotating the second coordinate system based on the second position information, and may optionally also involve fine correction of scale, orthogonality, keystone and other distortions. The method optionally includes applying a second exposure to the workpiece using the second coordinate system.

This method and any of the following variations can be extended by processing exposed patterns on the workpiece to produce electronic structures of a flat-panel display. These electronic structures may be, without limitation, light emitting diodes, plasma cells, or a liquid crystal shutters. They also may be filters or control components.

The foregoing methods can be combined with one or more the following features. In some implementations, the dry method forms the fiducials in a polymer layer of photoresist.

In some implementations, the dry method forms the fiducials by mechanical indentation. The mechanical indentation can expose a first patterning layer on the workpiece through the exposure sensitive layer. Or, it can at least partially penetrates a first patterning layer on the workpiece underlying the exposure sensitive layer.

In some implementations, the dry method forms the fiducials by depositing material on the exposure sensitive layer.

In some implementations, the dry method forms the fiducials by laser ashing or ablation of the exposure sensitive layer.

Physical removal of the workpiece from the writing system may further include subjecting the workpiece to processing steps between writing of exposures on two pattern layers. This may include at least one etching step, wherein the etching transfers the fiducials or an inverted pattern from the fiducials onto a patterning layer underlying the exposure sensitive layer.

When the workplace is replaced in the writing system, it may be rotated between writing of two exposures of the exposure sensitive layer.

Applying this method, the measuring and recording position information can share optical components with the writing of the exposures to the exposure sensitive layer(s).

The patterning of two patterning layers can produce at least three types of transmissiveness through the workpiece and patterning layers. In some implementations, the three types of transmissiveness are clear, grey (translucent, partially opaque) and dark (opaque.) In other implementations, one or more of the types of transmissiveness involves phase shifting.

The methods and any aspects of the methods described above can be practiced in an alignment and writing system. In one implementation, the system aligns a workpiece between two exposure patterning operations. This system includes a dry fiducial forming station that physically modifies an exposure sensitive layer on a workpiece to produce a fiducial in or on the exposure sensitive layer. As described below, the dry fiducial forming station can include a mechanical press, a laser ashing or ablation tool or an inkjet or other material deposition/printing head. The system further includes a stage that receives the workpiece for exposure using a writing system. It includes optics, a detector and a location processor that measure and record first position information of the fiducials in a first coordinate system used by the writing system to apply a first exposure to the workpiece. The system, the optics, detector and location processor further measure and record second position information of the fiducials or of a transfer from the fiducials onto another layer of the workpiece after repositioning of the workpiece on the stage. An exposure controller included the system uses the second position information to align a second coordinate system relative to the first coordinate system and to apply a second exposure to the workpiece using the second coordinate system.

This system can be combined with one or more of the following features. In one implementation, the dry fiducial forming station can physically modify a polymer layer of photoresist. It can include a point and a ram that form the fiducials by mechanical indentation. The mechanical indentation can expose a first patterning layer on the workpiece through the exposure sensitive layer. Or, the mechanical indentation can at least partially penetrate a first patterning layer on the workpiece underlying the exposure sensitive layer.

In some implementations, the dry fiducial forming station includes a writing head that deposits material on the exposure sensitive layer.

In some implementations, the dry fiducial forming station includes a laser and optics that ash or ablate of the exposure sensitive layer.

The system optics, detector and location processor can further estimate a rotation of the workpiece between the writing of two exposures of the exposure sensitive layer. Or, they can estimate a rotation of the workpiece between the writing of exposures to two different exposure sensitive layers on the workpiece.

The optics used with the detector and the location processor are also used by writing system to apply the exposures to the exposure sensitive layer(s).

Patterning two patterning layers using this system using the system can produce at least three types of transmissiveness through the workpiece and patterning layers, as described above.

While the technology disclosed is disclosed by reference to the embodiments and examples detailed above, it is understood that these examples are intended in an illustrative rather than in a limiting sense. Computer-assisted processing is implicated in the described implementations. It is contemplated that modifications and combinations will readily occur to those skilled in the art, which modifications and combinations will be within the spirit of the technology disclosed and the scope of the following claims.

I claim as follows:

1. A method of aligning a workpiece between two exposure patterning operations, the method including:
   forming fiducials by mechanical indentation using a point and a ram in an exposure sensitive layer on a workpiece to expose a first patterning layer underlying the exposure sensitive layer on the workpiece;
   measuring and recording first position information of the fiducials relative to a pattern of a first exposure in a first coordinate system, wherein the first coordinate system is used by a writing system to apply the first exposure to the workpiece;
   physically moving the workpiece and repositioning it in the writing system;
   measuring and recording second position information of the fiducials or of a transfer from the fiducials onto another layer of the workpiece;
   using the second position information to align a second coordinate system relative to the first coordinate system; and
   applying a second exposure to the workpiece using the second coordinate system.

2. The method of claim 1, wherein the mechanical indentation forms the fiducials in a polymer layer of photoresist.

3. The method of claim 1, wherein the mechanical indentation at least partially penetrates the first patterning layer.

4. The method of claim 1, wherein the workpiece is physically removed from the writing system and subject to processing steps between writing of exposures on two pattern layers.

5. The method of claim 1, wherein the workpiece is physically removed from the writing system between the writing of two exposures of the exposure sensitive layer and etched, wherein the etching transfers the fiducials or an inverted pattern from the fiducials onto a patterning layer underlying the exposure sensitive layer.

6. The method of claim 1, wherein the workpiece is physically removed from the writing system and rotated between the writing of two exposures of the exposure sensitive layer.

7. The method of claim 1, wherein the measuring and recording position information shares optical components with the writing of the exposures to the exposure sensitive layer(s).

8. The method of claim 1, wherein the workpiece is a photomask, further including patterning two patterning layers and producing at least three types of transmissiveness through the workpiece and patterning layers.

9. The method of claim 1, further including processing exposed patterns on the workpiece to produce electronic structures of a flat-panel display.

10. The method of claim 9, wherein the electronic structures produced are transistors, light emitting diodes, plasma cells, liquid crystal shutters, or filters.

11. The method of claim 1, further including using the second position information to compensate for distortion of the workpiece when aligning the second coordinate system relative to the first coordinate system.

12. The method of claim 1, wherein using the second position information to align a second coordinate system relative to the first coordinate system further includes adjusting the second coordinate system for scale, orthogonality or keystone distortions of the workpiece using the second position information.

13. A system that aligns a workpiece between two exposure patterning operations, the system including:
   a mechanical indentation fiducial forming station including a point and a ram that physically modifies an exposure sensitive layer to expose a first patterning layer underlying the exposure sensitive layer on the workpiece;

a stage that receives the workpiece for exposure using a writing system;

optics, a detector and a location processor that measure and record first position information of the fiducials relative to a pattern of a first exposure in a first coordinate system, wherein the first coordinate system is used by the writing system to apply the first exposure to the workpiece;

wherein the optics, detector and location processor further measure and record second position information of the fiducials or of a transfer from the fiducials onto another layer of the workpiece after repositioning of the workpiece on the stage; and an exposure controller that uses the second position information to align a second coordinate system relative to the first coordinate system and to apply a second exposure to the workpiece using the second coordinate system.

14. The system of claim 13, wherein the mechanical indentation fiducial forming station physically modifies a polymer layer of photoresist.

15. The system of claim 13, wherein the mechanical indentation at least partially penetrates the first patterning layer on the workpiece underlying the exposure sensitive layer.

16. The system of claim 13, wherein the optics, a detector and a location processor further estimate a rotation of the workpiece between the writing of two exposures of the exposure sensitive layer.

17. The system of claim 13, wherein the optics, a detector and a location processor further estimate a rotation of the workpiece between the writing of exposures to two different exposure sensitive layers on the workpiece.

18. The system of claim 13, wherein the optics used with the detector and the location processor are also used by writing system to apply the exposures to the exposure sensitive layer(s).

19. The system of claim 13, wherein the workpiece is a photomask, further including patterning two patterning layers using the system produces at least three types of transmissiveness through the workpiece and patterning layers.

* * * * *

UNITED STATES PATENT AND TRADEMARK OFFICE
CERTIFICATE OF CORRECTION

PATENT NO.          : 9,459,540 B2
APPLICATION NO.     : 14/207467
DATED               : October 4, 2016
INVENTOR(S)         : Torbjörn Sandström It is certified that error appears in the above-identified patent and that said Letters Patent is hereby corrected as shown below:

On the Title Page

Item (71), Applicant name, change "Micronic Mydata AB" to --Mycronic AB--.

Signed and Sealed this
Twenty-eighth Day of February, 2017

Michelle K. Lee
*Director of the United States Patent and Trademark Office*